(12) United States Patent
Yu

(10) Patent No.: US 7,449,973 B2
(45) Date of Patent: Nov. 11, 2008

(54) SEMICONDUCTOR CIRCUIT FOR REDUCING FLICKER NOISE

(76) Inventor: Jin-Hyuck Yu, 106-401 Daechung Apt., Byeongjeom-ri, Taean-eup, Hwaseong-si, Seoul (KR)

( * ) Notice: Subject to any disclaimer, the term of this patent is extended or adjusted under 35 U.S.C. 154(b) by 60 days.

(21) Appl. No.: 11/438,861

(22) Filed: May 23, 2006

(65) Prior Publication Data

US 2007/0046386 A1 Mar. 1, 2007

(30) Foreign Application Priority Data

Aug. 25, 2005 (KR) .................. 10-2005-0078084

(51) Int. Cl.
*H03B 5/00* (2006.01)
(52) U.S. Cl. ............. 331/185; 331/117 FE; 327/530; 327/534; 327/427; 327/437
(58) Field of Classification Search ............. 331/167, 331/117 FE, 117 R, 185; 327/530, 543, 427, 327/437
See application file for complete search history.

(56) References Cited

U.S. PATENT DOCUMENTS 6,218,892 B1 4/2001 Soumyanath et al.
6,445,216 B1 9/2002 Bruneau et al.
6,445,257 B1 9/2002 Cox et al.
6,943,637 B2 * 9/2005 Ruffieux .............. 331/117 FE

FOREIGN PATENT DOCUMENTS

KR 0012856 6/1994
KR 1020050007755 4/2005

OTHER PUBLICATIONS

English Abstract for Publication No. 1994-0012856.

* cited by examiner

*Primary Examiner*—Arnold Kinkead
(74) *Attorney, Agent, or Firm*—F. Chau & Assoc., LLC

(57) ABSTRACT

A semiconductor circuit for reducing flicker noise includes a negative-conductance generator and a body bias voltage supplying circuit. The negative-conductance generator includes a pair of cross-coupled field effect transistors in order to generate negative-conductance, wherein each field effect transistor includes a body. In order to remove flicker noise generated by the pair of the field effect transistors, the body bias voltage supplying circuit supplies a body bias voltage to the body of each of the pair of the field effect transistors so that a forward bias voltage is supplied to the body and source of each of the pair of the field effect transistors. The field effect transistors are preferably NMOS transistors or CMOS transistors. The semiconductor circuit is used in a voltage controlled oscillator (VCO) or a phase-locked loop (PLL).

9 Claims, 4 Drawing Sheets

SEMICONDUCTOR CIRCUIT FOR REDUCING FLICKER NOISE

CROSS-REFERENCE TO RELATED PATENT APPLICATION

This non-provisional application claims priority under 35 U.S.C. 119 to Korean Patent Application No.10-2005-0078084, filed on Aug. 25, 2005, in the Korean Intellectual Property Office (KIPO), the contents of which are incorporated herein by reference.

BACKGROUND OF THE INVENTION

1. Technical Field

The present disclosure relates to a semiconductor circuit, and more particularly, to a semiconductor circuit for reducing flicker noise or phase noise, and a voltage controlled oscillator (VCO) including the semiconductor circuit.

2. Discussion of the Related Art

Voltage controlled oscillators (VCOs) have output signals with desired oscillation frequencies in response to external control voltages, and are used, for example, in phase-locked loops (PLLs), analog sound mixing apparatuses, and mobile terminals.

The phase noise of a VCO is important as affecting the performance of the VCO. Accordingly, the less the phase noise of a VCO, the better the performance of the VCO. The main cause of the phase noise is called "flicker noise" or "1/f noise".

FIG. 1 is a circuit diagram of a negative conductance generator implemented in a conventional VCO 10. Referring to FIG. 1, the VCO 10 includes a negative conductance generator 20 and an LC tank circuit 30.

The negative conductance generator 20, which is a frequency source, generates a signal with a predetermined frequency using negative conductance. The LC tank circuit 30 includes inductors L and capacitors C, and generates a signal with a desired frequency, in response to the signal with the predetermined frequency and a control voltage Vctl.

Referring to FIG. 1, since each body of cross-coupled NMOS transistors 21 and 23 is grounded, the NMOS transistors 21 and 23 are adversely affected by flicker noise. Accordingly, the VCO 10 including the cross-coupled NMOS transistors 21 and 23 is vulnerable to phase noise.

SUMMARY OF THE INVENTION

Embodiments of the present invention provide a semiconductor circuit for reducing flicker noise and/or phase noise, and a voltage controlled oscillator (VCO) including the semiconductor circuit.

According to an embodiment of the present invention, there is provided a semiconductor circuit including a negative-conductance generator and a body bias voltage supplying circuit. The negative-conductance generator includes a pair of cross-coupled field effect transistors to generate negative-conductance, wherein each field effect transistor includes a body. In order to remove flicker noise generated by the pair of the field effect transistors, the body bias voltage supplying circuit supplies a body bias voltage to the body of each of the pair of the field effect transistors so that a forward bias voltage is supplied to the body and a source of each of the pair of field effect transistors.

The semiconductor circuit can be used in a voltage controlled oscillator (VCO) or a phase-locked loop (PLL). The body bias voltage supplying circuit supplies the forward bias voltage to junctions of bodies and sources of NMOS transistors in a VCO including the NMOS transistors and CMOS transistors.

The body bias voltage supplying circuit includes a current generation circuit and a voltage generation circuit. The current generation circuit includes: a transistor having a first terminal, a second terminal connected to the body of each of the field effect transistors, and a gate through which a enable signal is received; and a resistor connected between a power source and the first terminal.

The voltage generation circuit includes a diode or a resistor connected between the body of each of the pair of the field effect transistors and a ground voltage.

BRIEF DESCRIPTION OF THE DRAWINGS

Exemplary embodiments of the present invention can be understood in more detail from the following descriptions taken in conjunction with the attached drawings in which.

DESCRIPTION OF EXEMPLARY EMBODIMENTS

Figure 1:
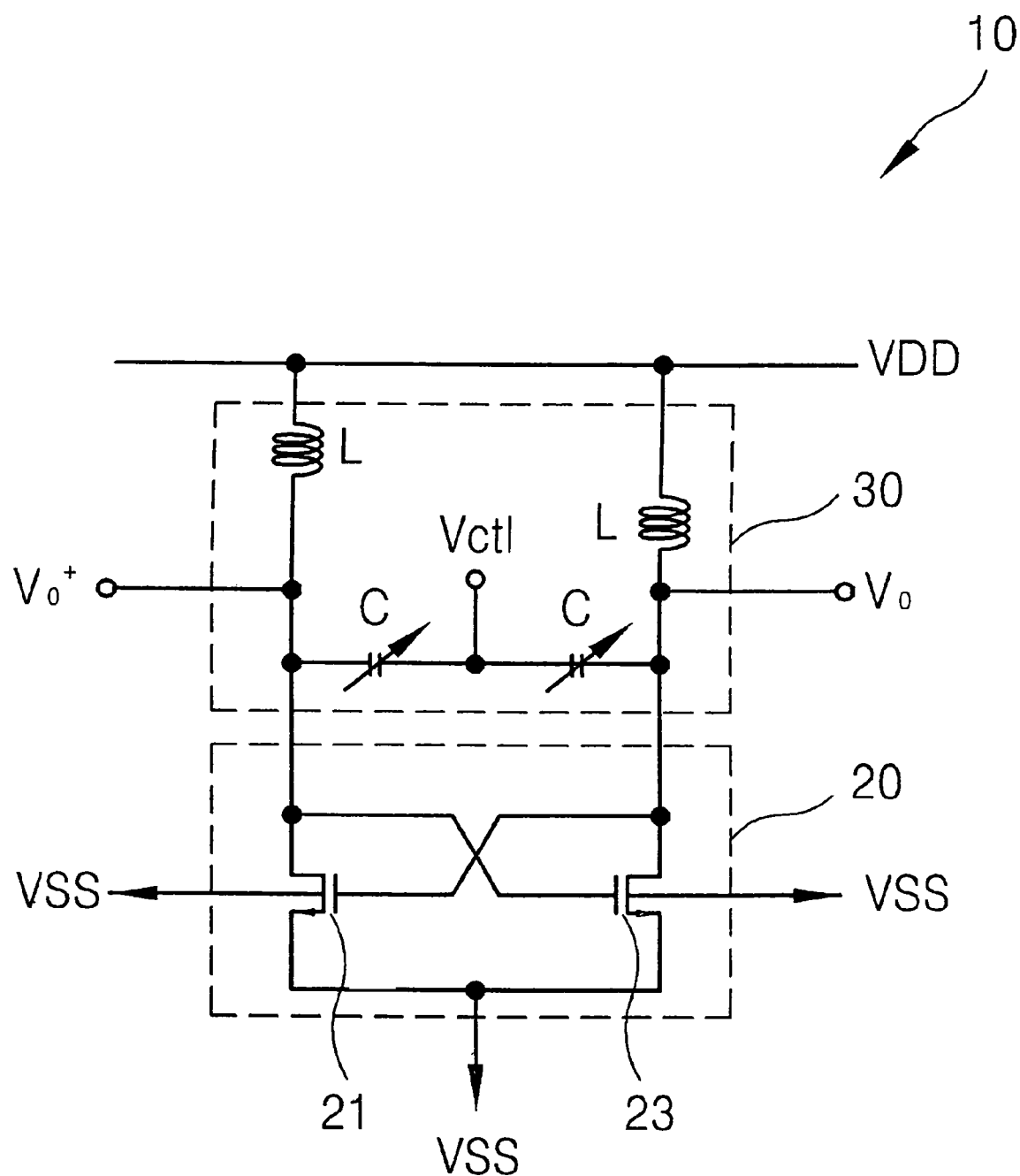
FIG. 1 is a circuit diagram of a negative conductance generator implemented in a conventional voltage controlled oscillator (VCO)

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements.

Figure 2:
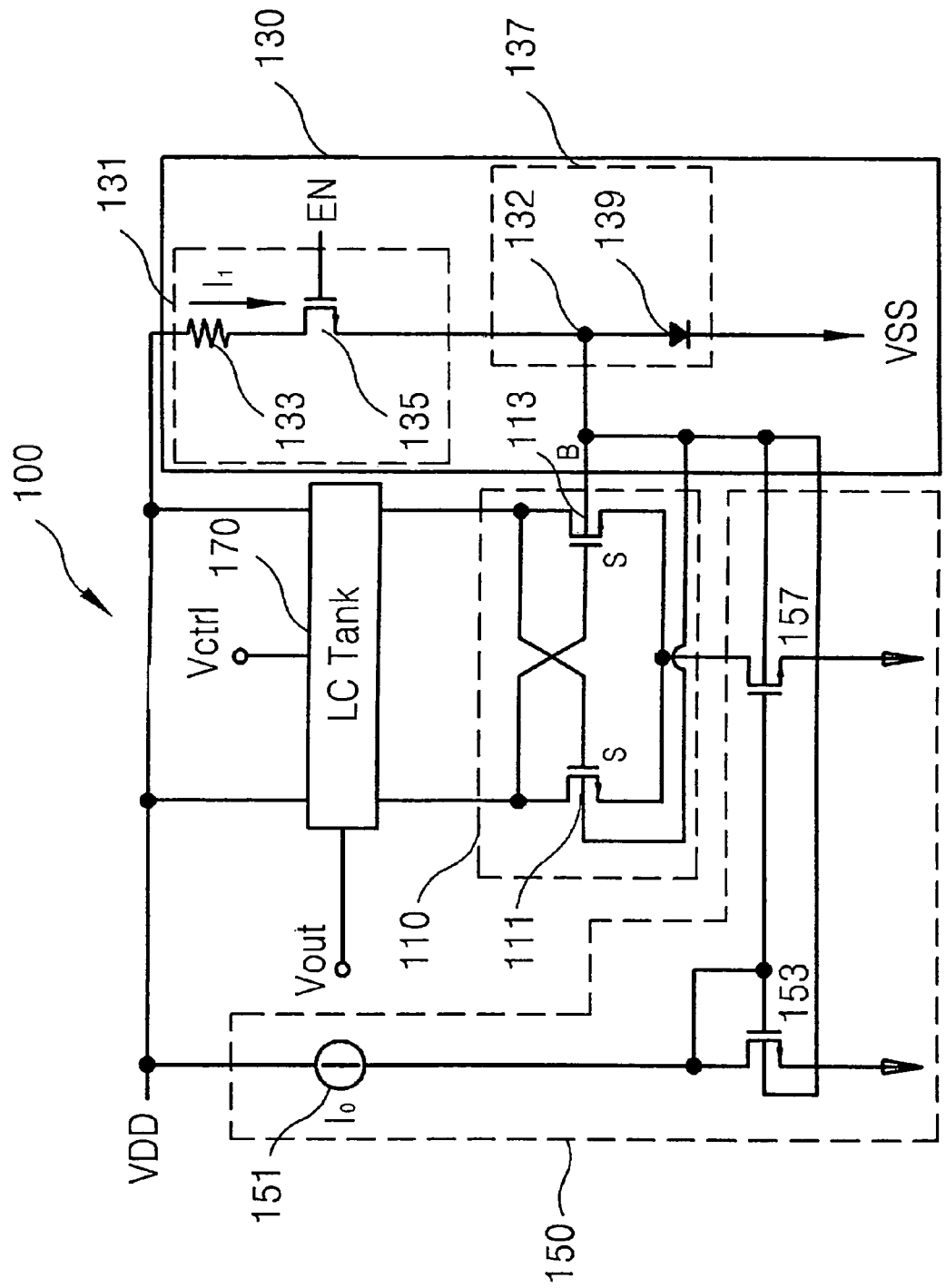
FIG. 2 is a circuit diagram of a VCO including a body bias voltage supplying circuit and a negative conductance generator according to an embodiment of the present invention.

FIG. 2 is a circuit diagram of a voltage controlled oscillator (VCO) including a body bias voltage supplying circuit and a negative conductance generator, according to an embodiment of the present invention. Referring to FIG. 2, the VCO 100 includes the negative conductance generator 110, the body bias voltage supplying circuit 130, a current source 150, and an LC tank circuit 170.

The negative conductance generator 110 includes cross-coupled field effect transistors 111 and 113 and generates negative conductance using the transistors 111 and 113. The cross-coupled field effect transistors 111 and 113 may be an NMOS transistor or a CMOS transistor, respectively. Also, the cross-coupled transistors 111 and 113 can be manufactured by a triple-well CMOS process.

The body bias voltage supplying circuit 130 supplies a predetermined positive voltage to a body B of each of the cross-coupled field effect transistors 111 and 113 so a junction bias voltage of the body B and source S of each of the cross-coupled field effect transistors 111 and 113 is in a forward bias state. That is, the body bias voltage supplying circuit 130 supplies a forward bias voltage to junctions of bodies and sources of NMOS transistors in a VCO including the NMOS transistors or CMOS transistors.

The body bias voltage supplying circuit 130 includes a current generation circuit 131 and a voltage generation circuit 137. The current generation circuit 131 includes a resistor 133 and a switching circuit 135. The resistor 133 is connected to a supply voltage VDD and one terminal of the switching circuit 135. The switching circuit 135 supplies a predetermined current 11 to a node 132 in response to an enable signal EN. The switching circuit 135 may be a MOS transistor which is switched in response to the enable signal EN.

The voltage generation circuit 137 is connected between the node 132 and a ground VSS, and generates a predetermined voltage so a junction bias voltage of the body and source of each of the cross-coupled field effect transistors 111 and 113 becomes positive.

For example, if the body node B is grounded while the source node S is maintained at a voltage of about 0.2 V, the junction bias voltage of the body B and source S of each of the cross-coupled field effect transistors 111 and 113 becomes about −0.2 V. Accordingly, if the voltage generation circuit 137 supplies a voltage higher than about 0.2 V to the bodies of the respective cross-coupled field effect transistors 111 and 113, the junction bias voltage of the body and source of each of the cross-coupled field effect transistors 111 and 113 will be positive.

The voltage generation circuit 137 may be a diode 139. Accordingly, the voltage generation circuit 137 generates a voltage of about 0.7 V, so that the junction bias voltage of the body and source of each of the cross-coupled field effect transistors 111 and 113 becomes approximately 0.5 V. The diode 139 can be substituted by a resistor having predetermined resistance.

When the junction bias voltage of the body and source of each of the cross-coupled field effect transistors 111 and 113 becomes positive by the voltage generation circuit 137, current noise power spectral density (Sid) in the drain of each of the cross-coupled field effect transistors 111 and 113 can be expressed by equation 1.

$$Sid = \frac{I_{DS}^2 q^4 \lambda N_t}{L^2 W k T f^y} \int_0^L \frac{1}{(C_{ox} + C_d + C_T - Q_n/V_T)^2} dy \quad (1)$$

Here, $V_T(=kT/q)$ is a thermal voltage, k is the Boltzmann's constant, $q=1.6\times10^{-16}$ (C), $\lambda$ is the tunneling constant of electrons, T is an absolute temperature, $C_{ox}$ is oxide capacitance per unit area, $C_d$ is depletion layer capacitance per unit area, $C_T$ is interface charge capacitance per unit area, $N_t$ is trap carrier density per unit area, $Q_n$ is inversion carrier density per unit area, L is an valid channel length, W is an valid channel width, and y is an exponent in the range between about 0.8 and about 1.2.

Referring to equation 1, if a forward bias voltage is supplied to the body and source of each of the cross-coupled field effect transistors 111 and 113, the current noise power spectral density Sid decreases due to the increase of the depletion layer capacitance $C_d$. Accordingly, the flicker noise (or the 1/f noise) of each of the cross-coupled field effect transistors 111 and 113 is reduced, which results in reducing the phase noise of the VCO 100 including the body bias voltage supplying circuit 130.

The current source 150 includes a constant current source 151 and transistors 153 and 157 forming a current mirror. The body of each of the transistors 153 and 157 is connected to the node 132. That is, the body bias voltage supplying circuit 130 supplies a predetermined voltage to the body of each of the transistors 153 and 157 so a junction bias voltage of the body and source of each of the transistors 153 and 157 becomes a forward bias voltage. Accordingly, the flicker noise of the transistors 153 and 157 is reduced.

As well known to persons of ordinary skill in the art, the LC tank circuit 170 is an L-C resonator, and generates a signal Vout with a desired frequency based on a control voltage Vctrl and a signal with a predetermined frequency generated by the negative conductance generator 110.

Figure 3:
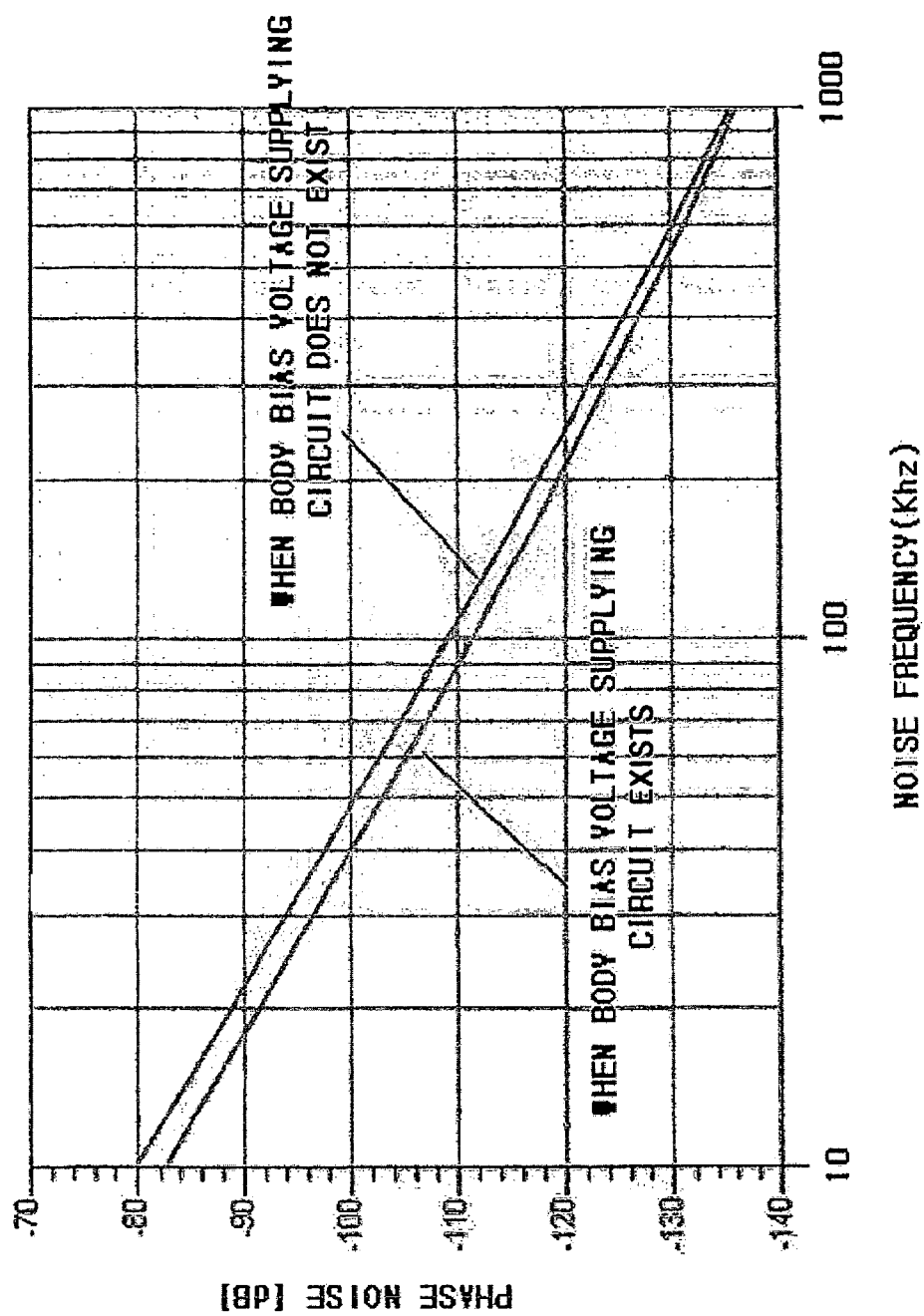
FIG. 3 is a graph plotting phase noise of the conventional VCO not including the body bias voltage supplying circuit and phase noise of the VCO including the body bias voltage supplying circuit according to an embodiment of the present invention.

FIG. 3 is a graph plotting the phase noise of a conventional VCO not including the body bias voltage supplying circuit and phase noise of the VCO including the body bias voltage supplying circuit according to an embodiment of the present invention.

Referring to FIG. 3, the phase noise of the VCO 100 is less by approximately 2.3 dB at an offset frequency of 100 KHz and less by approximately 1 dB at a frequency of 1 MHz, than the phase noise of the conventional VCO.

Figure 4:
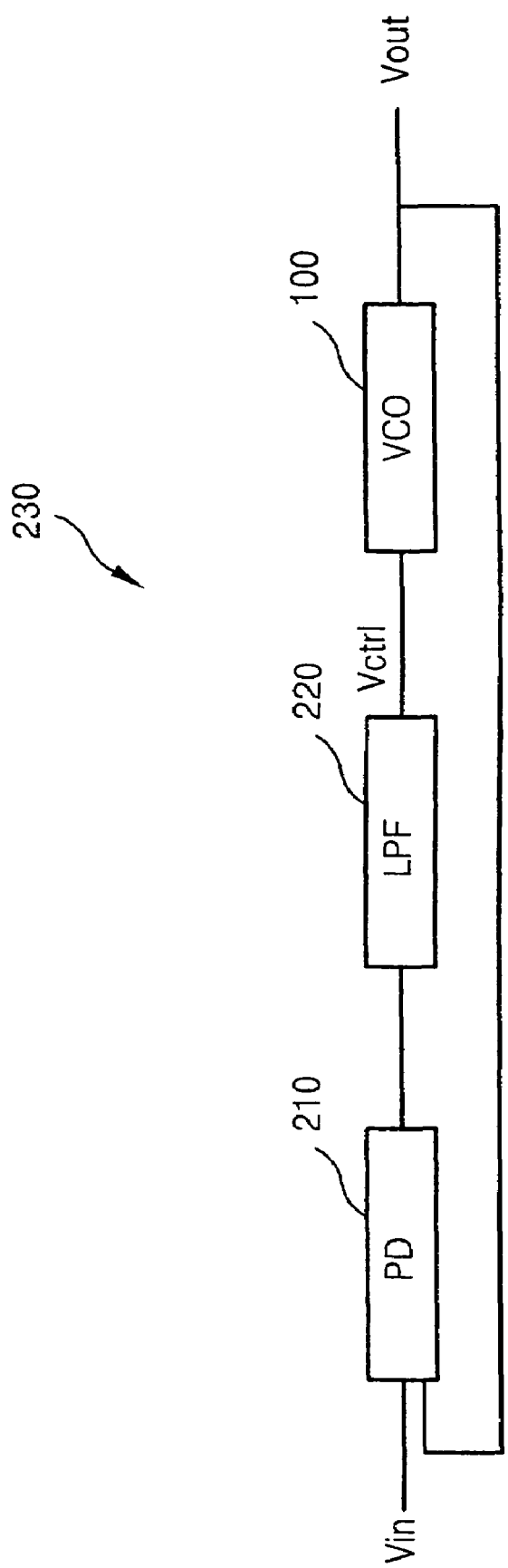
FIG. 4 is a block diagram of a phase-locked loop (PLL) including the VCO according to an embodiment of present invention.

FIG. 4 is a block diagram of a PLL including the VCO according to an embodiment of the present invention. Referring to FIG. 4, the PLL 230 includes a phase detector 210, a low pass filter 220 and the VCO 100.

The phase detector 210 compares a phase of an input signal Vin with a phase of an output signal Vout, and generates a detection signal corresponding to a difference between the two phases.

The low pass filter 220 receives the detection signal detected by the phase detector 210, performs low-pass filtering on the detection signal, and outputs the result as an output signal Vctrl.

The VCO 100 including the body bias voltage supplying circuit 130 according to the present embodiment receives the output signal Vctrl of the low pass filter 220 and generates an output signal Vout with a frequency proportional to the received output signal Vctrl.

As described above, by providing a semiconductor circuit (for example, a VCO or a PLL) including a body bias voltage supplying circuit, it is possible to reduce the flicker noise and/or phase noise of the VCO or PLL.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is

1. A semiconductor circuit comprising:
   a pair of field effect transistors, each field effect transistor including a body, cross-coupled to each other to generate negative conductance; and
   a body bias voltage supplying circuit supplying a body bias voltage to the body of each of the field effect transistors and including a current generation circuit supplying a predetermined current to the body of each of the field effect transistors in response to an enable signal enabling the body bias voltage supplying circuit, so that a junction bias voltage at a junction of the body and a source of each of the cross-coupled field effect transistors is in a forward bias state.

2. The semiconductor circuit of claim 1, wherein the body bias voltage supplying circuit further comprises:
   a voltage generation circuit generating the body bias voltage based on the predetermined current from the current generation circuit.

3. The semiconductor circuit of claim 2, wherein the current generation circuit comprises:
- a transistor having a first terminal, a second terminal connected to the body of each of the field effect transistors, and a gate through which the enable signal is received; and
- a resistor connected between a supply voltage and the first terminal.

4. The semiconductor circuit of claim 2, wherein the voltage generation circuit comprises a diode connected between the body of each of the field effect transistors and a ground voltage.

5. The semiconductor circuit of claim 2, wherein the voltage generation circuit comprises a resistor connected between the body of each of the field effect transistors and a ground voltage.

6. The semiconductor circuit of claim 1, further comprising at least one transistor connected between the body of each of the field effect transistors and a ground voltage and that acts as a current source, wherein the body bias voltage is also supplied to a body of the at least one transistor, so that a junction bias voltage of the body and a source of the at least one transistor becomes a forward bias voltage.

7. The semiconductor circuit of claim 1, wherein the field effect transistors are NMOS transistors or CMOS transistors.

8. The semiconductor circuit of claim 1, wherein the semiconductor circuit is a voltage controlled oscillator (VCO) or a phase-locked loop (PLL).

9. A circuit for reducing flicker noise in a voltage controlled oscillator or a phase-locked loop, the circuit comprising:
- a pair of field effect transistors, each field effect transistor including a body, cross-coupled to each other to generate negative conductance; and
- a body bias voltage supplying circuit supplying a body bias voltage to the body of each of the field effect transistors and including a current generation circuit supplying a predetermined current to the body of each of the field effect transistors in response to an enable signal enabling the body bias voltage supplying circuit, so that a junction bias voltage of the body and a source of each of the cross-coupled field effect transistors is in a forward bias state,
- wherein the body bias voltage supplying circuit further includes a voltage generation circuit generating the body bias voltage based on the predetermined current.

* * * * *